United States Patent
Muguruma

(10) Patent No.: US 9,475,262 B2
(45) Date of Patent: Oct. 25, 2016

(54) SOLAR-CELL SEALANT AND LAMINATED-GLASS INTERLAYER

(75) Inventor: Shinichi Muguruma, Kurashiki (JP)

(73) Assignee: KURARAY CO., LTD., Kurashiki-shi (JP)

(*) Notice: Subject to any disclaimer, the term of this patent is extended or adjusted under 35 U.S.C. 154(b) by 337 days.

(21) Appl. No.: 13/818,510

(22) PCT Filed: Aug. 18, 2011

(86) PCT No.: PCT/JP2011/068687
§ 371 (c)(1),
(2), (4) Date: Feb. 22, 2013

(87) PCT Pub. No.: WO2012/026393
PCT Pub. Date: Mar. 1, 2012

(65) Prior Publication Data
US 2014/0014178 A1  Jan. 16, 2014

(30) Foreign Application Priority Data

Aug. 23, 2010 (JP) ................................ 2010-185976
Mar. 25, 2011 (JP) ................................ 2011-068923
Mar. 31, 2011 (JP) ................................ 2011-079666

(51) Int. Cl.
- *B32B 17/06* (2006.01)
- *B32B 17/10* (2006.01)
- *H01L 31/048* (2014.01)

(52) U.S. Cl.
CPC ... *B32B 17/10761* (2013.01); *B32B 17/10036* (2013.01); *B32B 17/10678* (2013.01); *B32B 17/10798* (2013.01); *H01L 31/0481* (2013.01); *H01L 31/0488* (2013.01); *B32B 2457/12* (2013.01); *Y02E 10/50* (2013.01); *Y10T 428/3163* (2015.04)

(58) Field of Classification Search
USPC ....... 428/426, 428, 432, 409, 410, 688, 689, 428/699, 701, 702
See application file for complete search history.

(56) References Cited

U.S. PATENT DOCUMENTS

| | | | |
|---|---|---|---|
| 8,431,047 B2 * | 4/2013 | Ootsuki et al. | 252/500 |
| 2002/0198324 A1 * | 12/2002 | McKee et al. | 525/193 |
| 2006/0008658 A1 * | 1/2006 | Fukatani et al. | 428/437 |
| 2011/0049434 A1 | 3/2011 | Ootsuki et al. | |

FOREIGN PATENT DOCUMENTS

| | | |
|---|---|---|
| JP | 2002 514533 | 5/2002 |
| JP | 2004-67414 A | 3/2004 |
| JP | 2005-41747 A | 2/2005 |
| JP | 2005 219726 | 8/2005 |
| JP | 2009 298046 | 12/2009 |
| WO | 2009 151952 | 12/2009 |
| WO | 2010 055731 | 5/2010 |

OTHER PUBLICATIONS

Machine translation of JP 2005-219726; published Aug. 18, 2005; printed Dec. 15, 2014; pp. 1-14.*
The Solar Standard, 1st Edition, Total pp. 3, (May 2008) (with partial English translation).

(Continued)

*Primary Examiner* — Lauren R Colgan
(74) *Attorney, Agent, or Firm* — Oblon, McClelland, Maier & Neustadt, L.L.P.

(57) ABSTRACT

An encapsulant for solar cells, which can improve the load bearing property, and achieve the frameless implementation, the use of inexpensive glass, and the reduction in weight for photovoltaic modules. In addition, an interlayer film for laminated glass, which is excellent in adhesion to glass, and able to improve the load bearing property of laminated glass.

13 Claims, 4 Drawing Sheets

(56) References Cited

OTHER PUBLICATIONS

International Search Report Issued Nov. 22, 2011 in PCT/JP11/68687 Filed Aug. 18, 2011.

Chinese Office Action issued Oct. 29, 2014 in Patent Application No. 201180040890.3 (with English Translation).

Notification of Reasons for Refusal issued Apr. 14, 2015 in Japanese Patent Application No. 2012-530644 (with English language translation).

* cited by examiner

SOLAR-CELL SEALANT AND LAMINATED-GLASS INTERLAYER

CROSS-REFERENCE TO RELATED APPLICATIONS

This application is a National Stage of PCT/JP11/068687 filed Aug. 18, 2011. This application is based upon and claims the benefit of priority to Japanese Patent Application No. 2010-185976 filed Aug. 23, 2010, Japanese Patent Application No. 2011-068923 filed Mar. 25, 2011, and Japanese Patent Application No. 2011-079666 filed Mar. 31, 2011.

TECHNICAL FIELD

The present invention relates to an encapsulant for a solar cell, which is preferably used for bonding a solar cell element to a protective material, and to a photovoltaic module using the encapsulant. In addition, the present invention relates to an interlayer film for laminated glass, which is excellent in adhesion to glass and load bearing property, and to laminated glass using the interlayer film.

BACKGROUND ART

In recent years, from the aspects of effective use of resources, prevention of environmental pollution, and the like, solar cells for converting sunlight to electric energy have been used extensively, and further developed progressively.

Crystalline silicon solar cells are generally configured, as shown in FIG. 1, to have a plurality of photovoltaic cells 14 such as silicon power generation elements sealed with a front encapsulant 13A and a back encapsulant 13B such as ethylene-vinyl acetate polymers (EVA) films interposed between a front transparent protective member 11 and a back protective member (back cover) 12 composed of glass substrates or the like, and reinforced with a frame 15.

Thin-film silicon, cadmium-tellurium solar cells are generally configured, as shown in FIG. 2, to have a photovoltaic cell 16 prepared on a front transparent protective member 11 composed of a glass substrate or the like and have a back protective member (back cover) 12, which are sealed with an encapsulant 13 such as plasticized polyvinyl butyral and ethylene-vinyl acetate polymers (EVA) films interposed therebetween, and reinforced with a frame 15.

CIGS and CIS solar cells are generally configured, as shown in FIG. 3, to have a photovoltaic cell 16 prepared on a back protective member 12 composed of a glass substrate or the like and have a front transparent protective member 11 composed of glass, which are sealed with an encapsulant 13 such as plasticized polyvinyl butyral and ethylene-vinyl acetate polymers (EVA) films interposed therebetween, and reinforced with a frame 15.

While conventional solar cells are generally implemented through reinforcement with a frame as described above, further improvements in durability and reductions in cost have been required for the solar cells. The price of a frame is approximately twice to four times as high as that of an encapsulant, and frameless implementation is very useful for reductions in cost for solar cells.

Therefore, frameless solar cells have been proposed (for example, THE SOLAR STANDARD, No. 1). However, it is often the case that the back sides require a reinforcing structure in order to pass load bearing tests, and when the back sides require no reinforcing structure, expensive thermal toughening glass is used, and there has been thus a demand for further reductions in cost. While plasticized polyvinyl butyral is used extensively as the encapsulant in this case, property degradation is observed around a high temperature (50° C.), and there has been also a demand for improvements from the standpoint of durability. Due to the fact that solar cells generate heat during power generation, there is actually a possibility of a temperature rise to 50° C. or higher even in a usage environment at 20° C., and the load bearing property at high temperatures is thus of great importance.

In addition, the shock resistance is also of great importance in order to pass the MST32 shock fracture test in accordance with the Photovoltaic (PV) Module Safety Qualification (IEC61730-2).

In this context, it has been known that a polyvinyl butyral resin with a high volume resistivity is used as an encapsulant for solar cells (for example, WO 2009/151952A). However, in an example, the amount of a plasticizer used is large, with the result that properties are inadequate around 50° C., and the fluidity at a lamination temperature is inadequate, with the result that defects in appearance are likely to be caused, such as bubbles and defective adhesion.

Now, polyvinyl butyral resins have been conventionally formed into sheets, and used extensively as interlayer films for laminated glass such as window panes of buildings. However, glass plates may deviate by, or cause bubbles to be generated by heat in some cases after attaching the plates to each other, and furthermore, there is the problem of inadequate load bearing property, such as glass broken easily. In this context, sheets composed of ionomer resins have been proposed as glass laminates for danger-resistance window facilities, which are excellent in load bearing property (for example, JP 2002-514533A). However, the sheets of ionomer resins have low heat resistance, and inadequate properties around 50° C.

PRIOR ART DOCUMENTS

Patent Documents

Patent Document 1: WO 2009/151952A
Patent Document 2: JP 2002-514533A

Non-Patent Document

Non-Patent Document 1: "THE SOLAR STANDARD No. 1," [Online], May, 2008, APPLIED MATERIALS, [searched in June, 2010], Internet<URL:http://www.appliedmaterials.com/products/assets/news letters/solar_newsletter_may2008_japan.pdf>

SUMMARY OF INVENTION

Technical Problem

Further improvements in durability and reductions in cost have been desired for solar cells, and frameless modules have been examined. However, the back sides require a reinforcing structure, or use expensive thermal toughening glass. Therefore, an object of the present invention is to provide an encapsulant for solar cells, which can improve the load bearing property, and achieve the frameless implementation, the use of inexpensive glass, and the reduction in weight for solar cells. Furthermore, another object of the present invention is to provide a photovoltaic module which is inexpensive and excellent in durability.

In addition, another object of the present invention is to provide an interlayer film for laminated glass, which is excellent in adhesion to glass, and able to improve the load bearing property of laminated glass. In addition, another object of the present invention is to provide laminated glass at lower cost, because it also becomes possible to use inexpensive glass.

Solution to Problem

The type and thickness of the front transparent protective member 11, the type and thickness of the back protective member 12, and further the property of the encapsulant 13 for bonding the front transparent protective member 11 and the back protective member 12 to each other are important for the load bearing property of a solar cell.

The inventor has found, as a result of carrying out various examinations on the basis of this finding, that a high storage elastic modulus and high adhesion to glass can improve the load bearing property of a solar cell, and can improve the durability and load bearing property of laminated glass.

In particular, in order to improve the load bearing property in the case of an increase in temperature to around 50° C., the problem is solved by the invention with the use of an encapsulant for solar cells or an interlayer film for laminated glass, which has a storage elastic modulus of 1000 to 4000 MPa measured at a frequency of 0.3 Hz and 25° C. in accordance with JIS K 7244-4 and a compression shear strength of 5 to 80 MPa measured at 25° C. for a laminate with glass bonded at both surfaces.

The problem is also solved by an encapsulant for solar cells or an interlayer film for laminated glass, which has a storage elastic modulus of 50 to 4000 MPa measured at a frequency of 0.3 Hz and 50° C. in accordance with JIS K 7244-4 and a compression shear strength of 5 to 80 MPa measured at 50° C. for a laminate with glass bonded at both surfaces.

The encapsulant for solar cells according to the present invention can improve the load bearing property, and achieve the reduction in weight for solar cells, since the material is also capable of the frameless implementation and the use of inexpensive glass. Furthermore, the interlayer film for laminated glass according to the present invention is capable of providing laminated glass which is excellent in adhesion to the glass and excellent in load bearing property for making the glass less likely to be broken.

Preferred aspects of the encapsulant for solar cells or of the interlayer film for laminated glass according to the present invention will be described below.

A steel ball preferably does not penetrate through a laminate with glass of 2.8 mm in thickness bonded at both surfaces of the encapsulant for a solar cell or the interlayer film for laminated glass, when the steel ball is dropped from a height of 2 m to the laminate in accordance with the penetration resistance test of JIS R 3212.

In addition, the encapsulant for solar cells or the interlayer film for laminated glass preferably contains 40 mass % or more of polyvinyl acetal resin. In this case, the content of a plasticizer is more preferably 10 parts by mass or less with respect to 100 parts by mass of the polyvinyl acetal resin.

Furthermore, the present invention relates to an encapsulant for solar cells or an interlayer film for laminated glass, which contains 40 mass % or more of a polyvinyl acetal resin, and has a plasticizer content of 10 parts by mass or less with respect to 100 parts by mass of the polyvinyl acetal resin.

The average degree of polymerization of the polyvinyl acetal resin is preferably 600 to 1100.

In the case of containing the polyvinyl acetal resin as described above, the encapsulant or the interlayer film preferably further contains a rubber, and the content of the rubber is more preferably 1 to 100 parts by mass with respect to 100 parts by mass of the polyvinyl acetal resin.

The glass transition temperature of the rubber is preferably −10° C. or lower. In addition, the difference in refractive index between the rubber and the polyvinyl acetal resin is preferably 0.04 or less.

The present invention relates to a photovoltaic module using the encapsulant for solar cells.

The present invention relates to laminated glass using the interlayer film for laminated glass.

Advantageous Effect of the Invention

With the encapsulant for solar cells according to the present invention, solar cells can be prepared which have good load bearing properties. This encapsulant makes it possible to achieve the frameless implementation, the use of inexpensive glass, the reduction in weight for solar cells, and the improvement in durability. In addition, the interlayer film for laminated glass according to the present invention makes it possible to achieve laminated glass which is excellent in adhesion to glass, and excellent in load bearing property even when the temperature of the laminated glass is increased to relatively high temperatures.

DESCRIPTION OF EMBODIMENTS

In an aspect of the encapsulant for solar cells or of the interlayer film for laminated glass according to the present invention, the storage elastic modulus is 1000 to 4000 MPa, which is measured at a frequency of 0.3 Hz and 25° C. in accordance with JIS K 7244-4. The storage elastic modulus is preferably 1100 to 3000 MPa. The storage elastic modulus is further preferably 1200 to 2500 MPa. In the case of less than 1000 MPa, the load bearing property is inadequate undesirably. On the other hand, in the case of more than 4000 MPa, the production is of great difficulty. The encapsulant for solar cells or the interlayer film for laminated glass has a compression shear strength of 5 to 80 MPa measured at 25° C. for a laminate with glass bonded at both surfaces. The compression shear strength is preferably 10 to 80 MPa, and further preferably 10 to 60 MPa. It is to be noted that when the encapsulant for solar cells or the interlayer film for laminated glass contains a rubber, the compression shear strength measured at 25° C. for a laminate with glass bonded at both surfaces is preferably 7 to 80 MPa, more preferably 9 to 60 MPa, and further preferably 15 to 40 MPa. In the case of less than 5 MPa, there is undesirably the possibility of peeling from the glass due to the fact that the adhesion force is too low. On the other hand, in the case of more than 80 MPa, the production is of great difficulty. The encapsulant for solar cells or the interlayer film for laminated glass, which has a storage elastic modulus and adhesion to glass as described above can be obtained by optimizing the degree of acetalization with the use of a polyvinyl acetal resin, in particular, a polyvinyl butyral resin, and using a small amount of plasticizer, or no plasticizer at all. In addition, it is also effective to add inorganic particulates.

Figure 1:
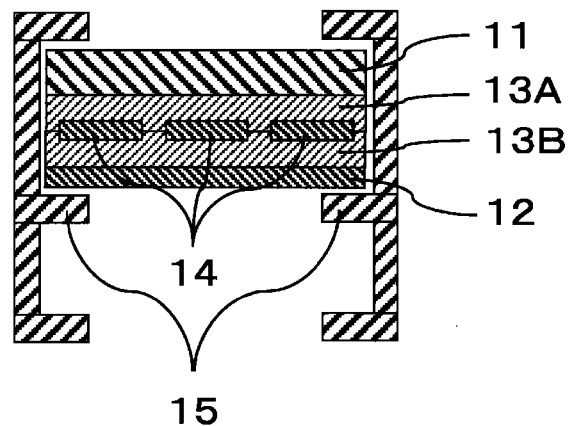
FIG. 1 is a cross-sectional view of a common crystalline silicon solar cell.
Figure 2:
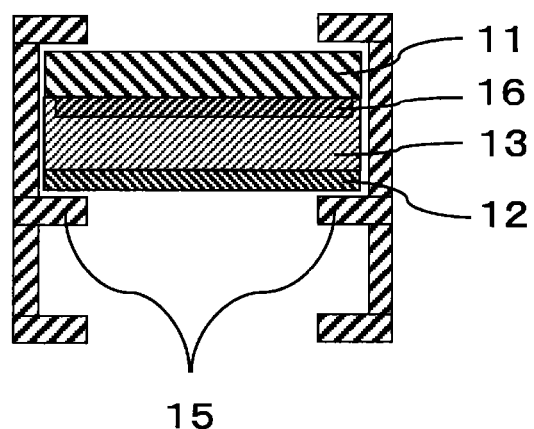
FIG. 2 is a cross-sectional view of a common thin-film silicon, cadmium-tellurium solar cell.
Figure 3:
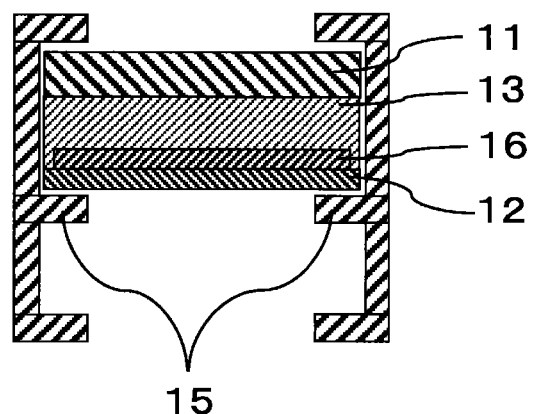
FIG. 3 is a cross-sectional view of a common CIGS or CIS solar cell.
Figure 4:
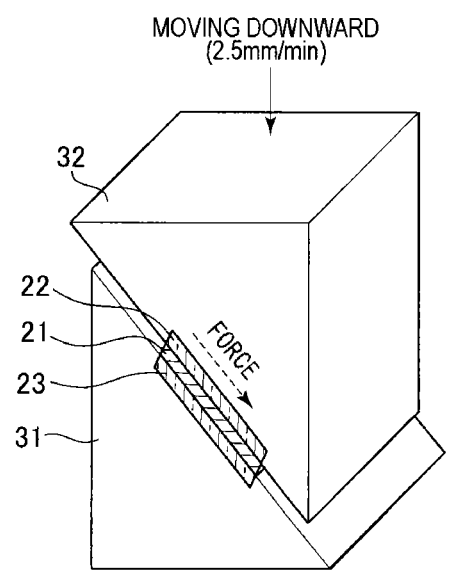
FIG. 4 is a jig for measuring a compression shear strength, which is used to measure adhesion to glass.
Figure 5:
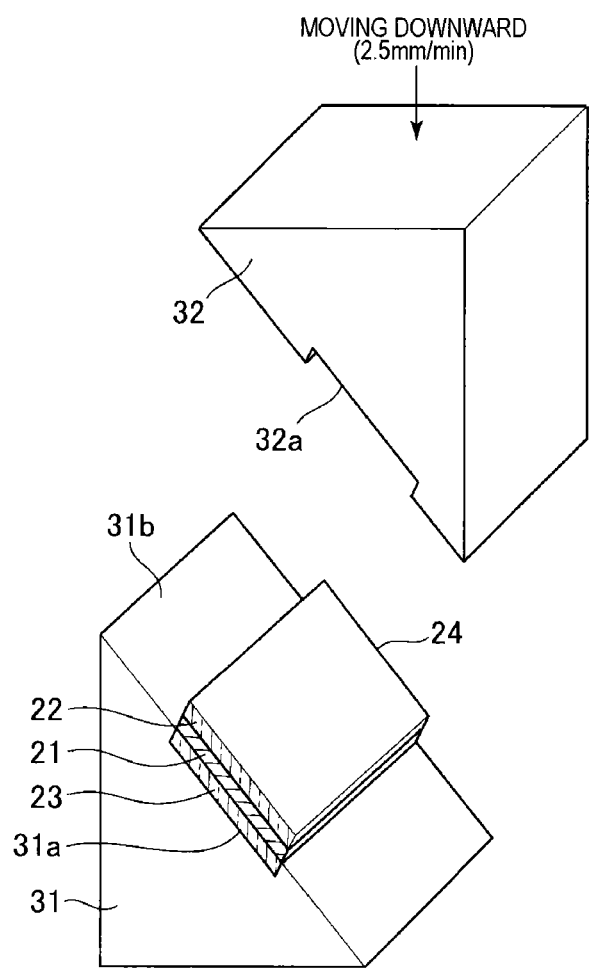
FIG. 5 is a jig for measuring a compression shear strength, which is used to measure adhesion to glass.

Next, a compression shear strength test will be described for measuring the adhesion to glass. The compression shear strength is measured with the use of a jig for measuring a compression shear strength as shown in FIGS. 4 and 5. First, a laminated glass sample 24 (25 mm×25 mm) is prepared which has an encapsulant (an encapsulant for solar cells or an interlayer film for laminated glass) 21 sandwiched between glass 23 and glass 22.

The laminated glass sample 24 is placed on a concave section 31a of a jig (lower section) 31 (see FIG. 5). The jig (lower section) 31 is placed on a flat surface parallel to the ground, and the incline with the concave section 31a is sloped with an angle of 45 degrees to the ground. The concave section 31a is recessed perpendicular to the incline. The depression of the concave section 31a and the bottom of the laminated glass sample 24 have the same square shape of 25 mm×25 mm, and it is possible to place the laminated glass sample 24 without being caught in the concave section 31a. The glass 23 constituting the laminated glass sample 24 is brought into contact with the jig (lower section) 31 in the concave section 31a.

The depth of the concave section 31a is shallower than the thickness of the laminated glass sample 24, and the upper section of the laminated glass sample 24, that is, the section composed of the glass 22 projects upward from an incline 31b of the jig (lower section) 31. As in the case of the jig (lower section) 31, the depression of a concave section 32a of a jig (upper section) 32 and the bottom of the laminated glass sample 24 have the same square shape of 25 mm×25 mm, and it is possible for the glass 22 projecting from the incline 31b to come into contact with and engage with the concave section 32a of the jig (upper section) 32. It is to be noted that the jig (upper section) 32 is fixed to a crosshead of a compression shear tester, while the incline with the concave section 32a is fixed to the crosshead of the compression shear tester so as to be sloped with an angle of 45 degrees to the ground, as in the case of the incline of the jig (lower section) 31. The concave section 32a is recessed perpendicular to the incline.

The jig (upper section) 32 fixed to the crosshead of the compression shear tester is lowered at a speed of 2.5 mm/min in a direction perpendicular to the ground until the concave section 32a comes into contact with the glass 22 of the laminated glass sample 24 (see FIG. 5). The crosshead is lowered at the speed of 2.5 mm/min even after the concave section 32a of the jig (upper section) 32 engages with the upper section of the laminated glass sample 24. As a result, shear stress is applied to the laminated glass sample 24, and at a certain point, a bonding failure is caused between the encapsulant 21 and the glass 22 or glass 23. The compression shear strength is to be measured in this case refers to shear stress at the point of a bonding failure caused. Six laminated glass samples 24 can be prepared to carry out the same test six times, and it can be regarded the average value as the bond strength of the encapsulant. It has been found that when the same test is carried out six times to obtain the average value, the error normally falls approximately within several percent.

Methods for preparing laminated glass samples 24 for carrying out the compression shear strength test include, for example, a preparation method of employing a vacuum bag method (condition: raising the temperature from 30° C. to 160° C. for 60 minutes, and then keeping the temperature at 160° C. for 30 minutes) with the encapsulant 21 sandwiched between two sheets of commercially available float glass (thickness: 3 mm, size: 25 mm×25 mm).

In another aspect of the encapsulant for solar cells or of the interlayer film for laminated glass according to the present invention, the storage elastic modulus is 50 to 4000 MPa, and more preferably 200 to 3000 MPa, which is measured at a frequency of 0.3 Hz and 50° C. in accordance with JIS K 7244-4. Furthermore, the storage elastic modulus is further preferably 500 to 2500 MPa. If the storage elastic modulus measured at a frequency of 0.3 Hz and 50° C. is less than 50 MPa, the load bearing property is inadequate undesirably particularly when the temperature is increased to around 50° C. On the other hand, in the case of more than 4000 MPa, the production is of great difficulty. When the storage elastic modulus measured at a frequency of 0.3 Hz and 50° C. is 200 MPa or more, the aspect is preferable particularly because of the high load bearing property. The encapsulant for solar cells or the interlayer film for laminated glass has a compression shear strength of 5 to 80 MPa, preferably 10 to 80 MPa, more preferably 10 to 60 MPa, and particularly preferably 10 to 30 MPa measured at 50° C. for a laminate with glass bonded at both surfaces. It is to be noted that when the encapsulant for solar cells or the interlayer film for laminated glass contains a rubber, the compression shear strength measured at 50° C. for a laminate with glass bonded at both surfaces is preferably 7 to 50 MPa, and more preferably 10 to 30 MPa. If the compression shear strength measured at 50° C. for a laminate with glass bonded at both surfaces is less than 5 MPa, there is undesirably the possibility of peeling from the glass due to the fact that the adhesion force is too low particularly when the temperature is increased to around 50° C. On the other hand, in the case of more than 80 MPa, the production is of great difficulty.

In addition, according the two aspects of the present invention, a steel ball preferably does not penetrate through a laminate with glass of 2.8 mm in thickness bonded at both surfaces of the encapsulant for a solar cell or the interlayer film for laminated glass, when the steel ball weighing 2260 kg is dropped from a height of 2 m to the laminate in accordance with the penetration resistance test of JIS R 3212. The type and thickness of the front transparent protective member 11, the type and thickness of the back protective member 12, and further the property of the encapsulant 13 for bonding the front transparent protective member 11 and the back protective member 12 to each other are important for the shock resistance of a solar cell, and above all, the property of the encapsulant 13 is particularly important. In general, encapsulants are considered to be preferably harder from the perspective of the load bearing property described above, whereas the encapsulants are considered to be preferably softer from the perspective of the shock resistance. Thus, it is extremely difficult to achieve a balance between the load bearing property and the shock resistance. In contrast, the encapsulant for a solar cell or the interlayer film for laminated glass as mentioned above, in which the steel ball does not penetrate when the steel ball is dropped from the height of 2 m, can achieve a balance between the load bearing property and the shock resistance in a photovoltaic module, or satisfy all of durability, the load bearing property, and the shock resistance in laminated glass. The use of such an encapsulant for solar cell, in which a steel ball does penetrate when the steel ball is dropped from a height of 2 m, has the possibility of resulting in insufficient shock resistance for a photovoltaic module obtained, and failing the MST32 shock fracture test in accordance with the Safety Qualification (IEC61730-2).

As will be described below, a predetermined amount of rubber mixed in the polyvinyl acetal resin makes it possible to achieve, while maintaining the storage elastic modulus and the compression shear strength, the encapsulant for solar cells or the interlayer film for laminated glass, with sufficient shock resistance, in which a steel ball does not penetrate when the steel ball is dropped from a height of 2 m in accordance with the penetration resistance test of JIS R 3212. A steel ball of 2260±20 g in mass and about 82 mm in diameter with a smooth surface is used as the steel ball herein.

The encapsulant for solar cells or the interlayer film for laminated glass according to the present invention preferably contains a polyvinyl acetal resin as its main constituent, specifically, preferably contains the polyvinyl acetal resin at 40 mass % or more, more preferably at 50 mass % or more, further preferably at 60 mass % or more, and particularly preferably at 80 mass % or more, and may be composed of only the polyvinyl acetal resin. If the content rate of the polyvinyl acetal resin is less than 40 mass %, there is a tendency of becoming difficult to achieve a desired storage elastic modulus, or resulting in insufficient adhesion to glass.

The polyvinyl acetal resin preferably has an average degree of acetalization from 40 to 90 mol %. In the case of less than 40 mol %, the water absorption rate is high undesirably. In the case of exceeding 90 mol %, a long period of time is required for the reaction time for obtaining the polyvinyl acetal resin, and may be undesirable in the process in some cases. 60 to 85 mol % is preferable, and further 65 to 80 mol % is more preferable from the perspective of water resistance.

The polyvinyl acetal resin is preferably one in which a vinyl acetate component is 30 mol % or less. In the case greater than 30 mol %, it is likely to cause blocking during the production of the resin, thus it becomes difficult to produce the resin. 20 mol % or less is preferable.

The polyvinyl acetal resin is usually composed of a vinyl acetal component, a vinyl alcohol component, and a vinyl acetate component, and the respective amounts of the components can be measured on the basis of, for example, JIS K 6728 "Polyvinyl Butyral Test Method" or a nuclear magnetic resonance method (NMR).

When the polyvinyl acetal resin contains the components other than the vinyl acetal component, the amount of the residual vinyl acetal component can be calculated by measuring the amount of the vinyl alcohol component and the amount of the vinyl acetate component, and subtracting the amounts of the both components.

The polyvinyl acetal resin can be produced by conventionally known methods, and typically, produced by acetalization of a polyvinyl alcohol with the use of an aldehyde. Specifically, the methods include a method for obtaining a polyvinyl acetal resin powder, in such a way that a polyvinyl alcohol is dissolved in warm water, a required acid catalyst and aldehyde are added to the obtained aqueous solution while keeping the aqueous solution at a predetermined temperature, for example, 0 to 96° C., preferably 10 to 20° C., thereby progressing an acetalization reaction while stirring, and then, the reaction temperature is increased to 70° C. for ripening, thereby completing the reaction, followed by neutralization, water washing, and drying.

The average degree of polymerization of the polyvinyl alcohol as a raw material for the polyvinyl acetal resin is preferably 100 or more, more preferably 400 or more, further preferably 600 or more, particularly preferably 700 or more, and the most preferably 750 or more. The excessively low average degree of polymerization of the polyvinyl alcohol may decrease the penetration resistance and creep resistance of a photovoltaic module obtained, in particular, the creep resistance under high temperature and humidity conditions such as 85° C. and 85% RH. In addition, the average degree of polymerization of the polyvinyl alcohol is preferably 5000 or less, more preferably 3000 or less, further preferably 2500 or less, particularly preferably 2300 or less, and the most preferably 2000 or less. The average degree of polymerization of the polyvinyl alcohol greater than 5000 may make it difficult to form resin films in some cases. Furthermore, in order to improve the laminate aptitude of an obtained encapsulant for solar cells or an obtained interlayer film for laminated glass, and obtain a photovoltaic module or laminated glass which is further excellent in appearance, the average degree of polymerization of the polyvinyl alcohol is preferably 1500 or less, more preferably 1100 or less, and further preferably 1000 or less. It is to be noted that since the average degree of polymerization of the polyvinyl acetal resin coincides with the average degree of polymerization of the polyvinyl alcohol as a raw material, the preferable average degree of polymerization of the polyvinyl alcohol mentioned above coincides with the preferable average degree of polymerization of the polyvinyl acetal resin.

The vinyl acetate component of the polyvinyl acetal resin obtained is preferably set to 30 mol % or less, and it is thus preferable to use a polyvinyl alcohol with a degree of saponification of 70 mol % or more. The degree of saponification of the polyvinyl alcohol less than 70 mol % may decrease the transparency or heat resistance of the resin in some cases, and also decrease the reactivity in some cases. 95 mol % or more is more preferable.

The average degree of polymerization of, and the degree of saponification of the polyvinyl alcohol can be measured on the basis of, for example, JIS K 6726 "Polyvinyl Alcohol Test Method."

The aldehyde for use in the acetalization of the polyvinyl alcohol is preferably an aldehyde having 1 to 12 carbon atoms. If the number of carbon atoms in the aldehyde is greater than 12, the reactivity of the acetalization will be decreased, and moreover, the resin will be likely to cause blocking in the reaction, and be associated with difficulty in the synthesis of the resin.

The aldehyde is not particularly limited, and examples thereof include, for example, aliphatic, aromatic, and alicyclic aldehydes such as formaldehyde, acetaldehyde, propionaldehyde, n-butyraldehyde, isobutyraldehyde, valeraldehyde, n-hexylaldehyde, 2-ethylbutyraldehyde, n-heptylaldehyde, n-octylaldehyde, n-nonylaldehyde, n-decylaldehyde, benzaldehyde, and cinnamaldehyde. Among these aldehydes, the aliphatic aldehydes are preferable which have 2 to 6 carbon atoms, and above all, butyraldehyde is particularly preferable. In addition, the aldehydes may be used by themselves, or two or more of the aldehydes may be used in combination. Furthermore, small amounts of multifunctional aldehydes and aldehydes having other functional groups may be used in combination in the range of 20 mass % or less of the total aldehydes.

In the encapsulant for solar cells or the interlayer film for laminated glass, which contains the polyvinyl acetal resin as its main constituent, a rubber is preferably mixed with the polyvinyl acetal resin from the perspective of improving the shock resistance of the encapsulant for solar cells or the interlayer film for laminated glass. By mixing the rubber in the polyvinyl acetal resin, the encapsulant for solar cells or the interlayer film for laminated glass, which further contains the rubber along with the polyvinyl acetal resin, is obtained.

The rubber for use in the present invention is not particularly limited, and examples thereof include, for example, silicone-acrylic composite rubbers, acrylic rubbers, silicone rubbers, butadiene rubbers (MBS, NBR, ABS, SBR, and the like), urethane rubbers, natural rubbers, chloroprene rubbers, butyl rubbers, ethylene-propylene rubbers, fluorine-containing rubbers, ethylene-vinyl acetate copolymers (EVA), polyester thermoplastic elastomers (TPEE), styrene thermoplastic elastomers, olefinic thermoplastic elastomers, and thermoset elastomers. Among these rubbers, in order to further improve the shock resistance, the silicone-acrylic composite rubbers, acrylic rubbers, and butadiene rubbers are preferable, and the silicone-acrylic composite rubbers and acrylic rubbers are more preferable. In addition, from the perspective of improving the shock resistance, rubbers are also preferable which are immiscible in the polyvinyl acetal resin, and thermoset elastomers are more preferable as such rubbers. It is to be noted that only one of the rubbers may be used by itself, or two or more thereof may be used in combination.

From the perspective of further improving the shock resistance, the glass transition temperature of the rubber is preferably −10° C. or lower, more preferably −20° C. or lower, and further preferably −30° C. or lower. Although the lower limit of the glass transition temperature of the rubber is not particularly limited, the glass transition temperature of the rubber is preferably −200° C. or higher, and more preferably −150° C. or higher. As for the method for measuring the glass transition temperature, as in the case of examples described below, the glass transition temperature is measured on the basis of JIS K 7244-4: 1999, and the peak value of tan δ is employed.

In addition, the rubber preferably has an average particle size of 50 to 400 nm from the perspective of improving the shock resistance. The average particle size of the rubber can be obtained by, for example, a turbidimetric method.

In addition, from the perspective of improving the shock resistance, the content of the rubber is preferably 1 to 100 parts by mass, more preferably 3 to 80 parts by mass, and further preferably 5 to 60 parts by mass with respect to 100 parts by mass of the polyvinyl acetal resin. If the rubber content is less than 1 part by mass, the effect of improving the shock resistance is small. On the other hand, the rubber content greater than 100 parts by mass undesirably decreases the storage elastic modulus at room temperature (approximately 25° C.) and 50° C. and the adhesion force to glass, thereby possibly resulting in an insufficient rupture strength, and in addition, decreases the fluidity of the obtained encapsulant for solar cells or of the interlayer film for laminated glass, thereby making lamination difficult. The additive amount of the rubber may be selected appropriately depending on the composition, average degree of polymerization, and the like of the polyvinyl acetal resin used.

In addition, in the case of using the interlayer film for laminated glass according to the present invention for building purposes, the transparency of the interlayer film is also important. From the perspective of maintaining the transparency, the difference in refractive index between the rubber and the polyvinyl acetal resin is preferably 0.04 or less, more preferably 0.02 or less, and particularly preferably 0.01 or less. Further, from the perspective of further improving the transparency, it is preferable to use an acrylic rubber.

If necessary, it is also possible to control the adhesion of the encapsulant for solar cells or of the interlayer film for laminated glass to glass, and the like. Methods for controlling the adhesion usually include a method of adding an additive for use as an adhesion modifier for laminated glass, and a method of adding various types of additives for modifying the adhesion. By such a method, an encapsulant for solar cells or an interlayer film for laminated glass, which contains the adhesion modifier and/or the various types of additives for modifying the adhesion, is obtained.

As the adhesion modifier, for example, the materials disclosed in WO 03/033583A can be used, and alkali metal salts and alkaline-earth metal salts are preferably used, and examples of the salts include, for example, salts of potassium, sodium, magnesium, and the like. The salts include salts of organic acids such as carboxylic acids such as octanoic acid, hexanoic acid, butyric acid, acetic acid, and formic acid; and salts of inorganic acids such as hydrochloric acid and nitric acid.

While the most appropriate additive amount of the adhesion modifier differs depending on the additives used, the adhesion force of an obtained film (an encapsulant for solar cells or an interlayer film for laminated glass) to glass is preferably adjusted to 3 to 10, particularly to 3 to 6 when high penetration resistance is required, and to 7 to 10 when high glass shatterproof is required, in a Pummel test (as described in WO 03/033583A or the like). When high glass shatterproof is required, adding no adhesion modifier is also a useful method.

The various types of additives for modifying the adhesion include a silane coupling agent. Typically, the silane coupling agent is added in an amount of approximately 0.01 to approximately 5 mass % on the basis of the total mass of the composition (the encapsulant for solar cells or the interlayer film for laminated glass).

Plasticizers, antioxidants, ultraviolet absorbing agents, light stabilizers, antiblocking agents, pigments, dyes, functional inorganic compounds, and/or the like, may be further added, if necessary, to the encapsulant for solar cells or the interlayer film for laminated glass according to the present invention. In addition, if necessary, the contents of a plasticizer and various types of additives may be reduced once by extraction or washing, and the plasticizer, the additives and/or the like may be added newly.

Furthermore, in the production of the encapsulant for solar cells or of the interlayer film for laminated glass, which contains the polyvinyl acetal resin as its main constituent, unless contrary to the gist of the present invention, it is also possible to mix the polyvinyl acetal resin with other resins, and it is also possible to use a laminate of the polyvinyl acetal resin with other resins, as the encapsulant for solar cells or the interlayer film for laminated glass. In addition, it is also possible to mix inorganic matters (titanium oxide, talc, and/or the like).

By using the components added or mixed as described above, an encapsulant for solar cells or an interlayer film for laminated glass, which contains these components, can be obtained.

The plasticizer is not particularly limited, and examples thereof include di-(2-butoxyethyl)-adipate (DBEA), di-(2-butoxyethyl)-sebacate (DBES), di-(2-butoxyethyl)-azelate, di-(2-butoxyethyl)-glutarate, di-(2-butoxyethoxyethyl)-adipate (DBEEA), di-(2-butoxyethoxyethyl)-sebacate (DBEES), di-(2-butoxyethoxyethyl)-azelate, di-(2-butoxyethoxyethyl)-glutarate, di-(2-hexoxyethyl)-adipate, di-(2-hexoxyethyl)-sebacate, di-(2-hexoxyethyl)-azelate, di-(2-hexoxyethyl)-glutarate, di-(2-hexoxyethoxyethyl)-adipate, di-(2-hexoxyethoxyethyl)-sebacate, di-(2-hexoxyethoxyethyl)-azelate, di-(2-hexoxyethoxyethyl)-glutarate, di-(2-butoxyethyl)-phthalate, and/or di-(2-butoxyethoxyethyl)-phthalate. Among these plasticizers, plasticizers are preferable in which the sum of the numbers of carbon atoms and oxygen atoms constituting the molecules is greater than 28. Examples of the plasticizer include, for example, triethylene glycol-di(2-ethylhexanoate), tetraethylene glycol-di (2-ethylhexanoate), di-(2-butoxyethoxyethyl)-adipate, di-(2-butoxyethoxyethyl)-sebacate, and 1,2-cyclohexanedicarboxylic acid-diisononylester (DINCH). Above all, triethylene glycol-di(2-ethylhexanoate) and 1,2-cyclohexanedicarboxylic acid-diisononylester are preferable in that the plasticizers can achieve an intended plasticizing effect in small amounts without decreasing the compression shear strength or the adhesion to glass. The content of the plasticizer is preferably 10 parts by mass or less, more preferably 5 parts by mass or less, further preferably 2 parts by mass or less, and particularly preferably 0 parts by mass (that is, containing no plasticizer), with respect to 100 parts by mass of the polyvinyl acetal resin. In addition, two or more of the plasticizers may be used in combination.

In the encapsulant for solar cells or the interlayer film for laminated glass, which contains the polyvinyl acetal resin as its main constituent, the content of the plasticizer is of great importance, and if the content is greater than 10 parts by mass with respect to 100 parts by mass of the polyvinyl acetal resin, the storage elastic modulus at room temperature and 50° C. will be decreased undesirably. The additive amount thereof may be selected appropriately depending on the composition, molecular weight, and the like of the polyvinyl acetal resin used. Further, the encapsulant for solar cells or the interlayer film for laminated glass, in which the content of the plasticizer is 10 parts by mass or less (preferably 5 parts by mass or less, more preferably 2 parts by mass or less, further preferably 0 parts by mass) with respect to 100 parts by mass of the polyvinyl acetal resin, can improve the load bearing property of a photovoltaic module obtained, or improve the durability and load bearing property of laminated glass obtained. The present invention encompasses an encapsulant for solar cells or an interlayer film for laminated glass, which contains the polyvinyl acetal as its main constituent, and has a plasticizer content of 10 parts by mass or less (preferably 5 parts by mass or less, more preferably 2 parts by mass or less, further preferably 0 parts by mass) with respect to 100 parts by mass of the polyvinyl acetal resin. In this case, the encapsulant for solar cells or the interlayer film for laminated glass preferably contains the polyvinyl acetal resin at 40 mass % or more, more preferably at 50 mass % or more, further preferably at 60 mass % or more, and particularly preferably at 80 mass % or more, and may be composed of only the polyvinyl acetal resin.

The antioxidants include, for example, phenolic antioxidants, phosphorous antioxidants, and sulfur antioxidants, among these antioxidants, the phenolic antioxidants are preferable, and alkyl-substituted phenolic antioxidants are particularly preferable.

Examples of the phenolic antioxidants include acrylate compounds such as 2-t-butyl-6-(3-t-butyl-2-hydroxy-5-methylbenzyl)-4-methylphenylacrylate and 2,4-di-t-amyl-6-(1-(3,5-di-t-amyl-2-hydroxyphenyl)ethyl)phenylacrylate; alkyl-substituted phenolic compounds such as 2,6-di-t-butyl-4-methylphenol, 2,6-di-t-butyl-4-ethylphenol, octadecyl-3-(3,5-)di-t-butyl-4-hydroxyphenyl)propionate, 2,2'-methylene-bis(4-methyl-6-t-butylphenol), 4,4'-butylidene-bis(4-methyl-6-t-butylphenol), 4,4'-butylidene-bis(6-t-butyl-m-cresol), 4,4'-thiobis(3-methyl-6-t-butylphenol), bis (3-cyclohexyl-2-hydroxy-5-methylphenyl)methane, 3,9-bis (2-(3-(3-t-butyl-4-hydroxy-5-methylphenyl)propionyloxy)-1,1-dimethylethyl)-2,4,8,10-tetraoxaspiro[5,5]undecane, 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis(methylene-3-(3',5'-di-t-butyl-4'-hydroxyphenyl)propionate)methane, or triethylene glycol bis(3-(3-t-butyl-4-hydroxy-5-methylphenyl)propionate); and triazine-containing phenolic compounds such as 6-(4-hydroxy-3,5-di-t-butylanilino)-2,4-bis-octylthio-1,3,5-triazine, 6-(4-hydroxy-3,5-dimethylanilino)-2,4-bis-octylthio-1,3,5-triazine, 6-(4-hydroxy-3-methyl-5-t-butylanilino)-2,4-bis-octylthio-1,3,5-triazine, or 2-octylthio-4,6-bis-(3,5-di-t-butyl-4-oxyanilino)-1,3,5-triazine.

Examples of the phosphorous antioxidants include, for example, monophosphite compounds such as triphenyl phosphite, diphenyl isodecyl phosphite, phenyl diisodecyl phosphite, tris(nonylphenyl)phosphite, tris(dinonylphenyl) phosphite, tris(2-t-butyl-4-methylphenyl)phosphite, tris(cyclohexylphenyl)phosphite, 2,2-methylenebis(4,6-di-t-butylphenyl)octylphosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, or 10-decyloxy-9,10-dihydro-9-oxa-10-phosphaphenanthrene; and diphosphite compounds such as 4,4'-butylidene-bis(3-methyl-6-t-butyl-phenyl-di-tridecylphosphite), 4,4'-isopropylidene-bis(phenyl-di-alkyl(C12 to C15)phosphite), 4,4'-isopropylidene-bis(diphenylmonoalkyl(C12 to C15)phosphite), 1,1,3-tris(2-methyl-4-di-tridecylphosphite-5-t-butylphenyl)butane, or tetrakis(2,4-di-t-butylphenyl)-4,4'-biphenylenephosphite. Among these antioxidants, the monophosphite compounds are preferable.

The sulfur antioxidants include, for example, dilauryl-3,3'-thiodipropionate, distearyl-3,3'-thiodipropionate, laurylstearyl-3,3'-thiodipropionate, pentaerythritol-tetrakis-(β-lauryl-thiopropionate), and 3,9-bis(2-dodecylthioethyl)-2,4,8,10-tetraoxaspiro[5,5]undecane.

These antioxidants can be used by themselves or two or more thereof can be used in combination. The blending amount of the antioxidant falls within the range of 0.001 to 5 parts by mass, preferably 0.01 to 1 parts by mass, with respect to 100 parts by mass of the polyvinyl acetal resin. If the amount of the antioxidant is less than 0.001 parts by mass, insufficient effects may be produced in some cases, whereas no particular effects can be expected if the amount is greater than 5 parts by mass.

In addition, the ultraviolet absorbing agents include benzotriazole-based ultraviolet absorbing agents such as 2-(5-methyl-2-hydroxyphenyl)benzotriazole, 2-[2-hydroxy-3,5-bis(α,α'-dimethylbenzyl)phenyl]-2H-benzotriazole, 2-(3,5-di-t-butyl-2-hydroxyphenyl)benzotriazole, 2-(3-t-butyl-5-methyl-2-hydroxyphenyl)-5-chlorobenzotriazole, 2-(3,5-di-t-butyl-5-methyl-2-hydroxyphenyl)-5-chlorobenzotriazole, 2-(3,5-di-t-amyl-2-hydroxyphenyl)benzotriazole, or 2-(2'-hydroxy-5'-t-octylphenyl)benzotriazole; hindered amine ultraviolet absorbing agents such as 2,2,6,6-tetramethyl-4-piperidylbenzoate, bis(2,2,6,6-tetramethyl-4-piperidyl)sebacate, bis(1,2,2,6,6-pentamethyl-4-piperidyl)-2-(3,5-di-t-butyl-4-hydroxybenzyl)-2-n-butylmalonate, or 4-(3-(3,5-di-t-butyl-4-hydroxyphenyl)propionyloxy)-1-(2-(3-(3,5-di-t-butyl-4-hydroxyphenyl)propionyloxy)ethyl)-2,2,6,6-tetramethylpiperidine; and benzoate-based ultraviolet absorbing agents such as 2,4-di-t-butylphenyl-3,5-di-t-butyl-4-hydroxybenzoate or hexadecyl-3,5-di-t-butyl-4-hydroxybenzoate. The additive amounts of the ultraviolet absorbing agents are preferably 10 to 50,000 ppm, and more preferably in the range of 100 to 10,000 ppm on a mass basis to the polyvinyl acetal composition. If the additive amount is less than 10 ppm, insufficient effects may be produced in some cases, whereas no particular effects can be expected if the amount is greater than 50,000 ppm. Two or more of these ultraviolet absorbing agents can be also used in combination.

In addition, the light stabilizers include hindered amine light stabilizers, for example, "ADK STAB LA-57 (trade name)" from ADEKA Corporation.

The method for producing the encapsulant for solar cells or the interlayer film for laminated glass according to the present invention is not particularly limited, in which a predetermined amount of plasticizer, and if necessary, other additive agents are blended with the resin described above, subjected to uniform kneading, and then used to prepare a film (sheet) by a known film-forming method such as an extrusion method, a calendar method, a pressing method, a casting method, and a inflation method, and this film (sheet) can be used as the encapsulant for solar cells or the interlayer film for laminated glass.

Among known film forming methods, in particular, a method is preferably employed in which films (sheets) are produced with the use of an extruder is preferably employed. The resin temperature during the extrusion is preferably 150 to 250° C., and more preferably 170 to 230° C. If the resin temperature is excessively high, the polyvinyl acetal resin will be decomposed to increase the content of volatile substances. On the contrary, if the temperature is excessively low, the content of volatile substances will be also increased. In order to efficiently remove the volatile substances, the volatile substances are preferably removed by reducing the pressure from a vent of the extruder.

In addition, on the surface of the encapsulant for solar cells or the interlayer film for laminated glass according to the present invention, a concavo-convex structure is preferably formed by a conventionally known method such as melt fracture or emboss. The shape of the melt fracture or emboss is not particularly limited, and conventionally known shapes can be employed.

In addition, the total film thickness of the encapsulant for solar cells is preferably 20 to 10,000 μm, more preferably 100 to 3,000 μm, and further preferably 200 to 1,000 μm. The film thickness of the interlayer film for laminated glass is preferably 20 to 10,000 μm, and more preferably 100 to 3,000 μm. The excessively reduced film thickness may result in a failure to succeed in lamination for preparing a photovoltaic module or laminated glass, whereas the excessively increased film thickness undesirably leads to an increase in cost.

The encapsulant for solar cells according to the present invention can be used as an encapsulant for forming a photovoltaic module by sealing between a solar cell and a front transparent protective member, and between the solar cell and a back protective member. As such a photovoltaic module, various types of modules can be exemplified. The modules can include: a module configured to have a photovoltaic cell sandwiched by encapsulants from both sides of the cell, such as front transparent protective member/front encapsulant/photovoltaic cell/back encapsulant/back protective member; a module which has a configuration such as front transparent protective member/photovoltaic cell/encapsulant/back protective member; and a module which has a configuration such as front transparent protective member/encapsulant/photovoltaic cell/back protective member.

The photovoltaic cells constituting the photovoltaic module can include various types of photovoltaic cells such as: silicon-based cells such as single-crystalline silicon, polycrystalline silicon, and amorphous silicon cells; Group III-V and Group II-VI compound semiconductor cells such as gallium-arsenic, CIGS, cadmium-tellurium cells; and organic cells such as dye-sensitised and organic thin film cells.

Glass, acrylic resins, polycarbonates, polyesters, fluorine-containing resins, and the like can be exemplified as examples of the front transparent protective member constituting the photovoltaic module. In addition, single-layer or multilayer sheets such as metals and various types of thermoplastic resin films can be exemplified as the back protective member, and specifically, single-layer or multilayer sheets such as, for example, metals such as tin, aluminum, and stainless steel; inorganic materials such as glass; polyesters, polyesters with inorganic substances deposited, fluorine-containing resins, and polyolefins can be exemplified.

For the production of the photovoltaic module, a module configured as described already can be produced by a conventionally known method in which a film (sheet) of the encapsulant according to the present invention is prepared in advance for pressure bonding at a temperature at which the encapsulant is melted.

In the case of using a vacuum laminating machine, for example, a known machine for use in the production of photovoltaic modules is used for lamination at a temperature of 100 to 200° C., in particular, 130 to 170° C., under reduced pressure from 1 to 30,000 Pa. A method of using a vacuum bag or a vacuum ring is described in, for example, EP 1235683 B1, in which lamination is carried out, for example, at 130 to 170° C. under a pressure of approximately 20,000 Pa.

In the case of using a nip roll, for example, the methods can include a method performing first temporary pressure bonding at a temperature not higher than the flow start temperature of the polyvinyl acetal resin, and then, further temporary pressure bonding under a condition close to the flow start temperature. Specifically, the methods can include, for example, a method heating to 30 to 100° C. with the use of an infrared heater or the like, then degassing with the use of the roll, and further heating to 50 to 150° C., and then bonding or temporary bonding by pressure bonding with the use of the roll.

The autoclave step that is additionally carried out after the temporary pressure bonding is carried out at a temperature of 130 to 155° C. under a pressure of approximately 1 to 1.5 MPa for approximately 2 hours, depending on the thickness and configuration of the module.

The glass used when laminated glass is prepared with the use of the interlayer film for laminated glass according to the present invention is not particularly limited, conventionally known organic glass such as polymethylmethacrylate and polycarbonate can be used besides inorganic glass such as float plate glass, polished plate glass, figured glass, wire-reinforced plate glass, and heat-ray absorbing plate glass, and these types of glass may be either colorless or colored, and either transparent or opaque. These types of glass may be used by themselves, or two or more types thereof may be used in combination. In addition, the thickness of the glass is not particularly limited, but preferably 100 mm or less.

EXAMPLES

While the present invention will be specifically described below with reference to examples and comparative examples, the present invention is not to be considered limited to these examples.

It is to be noted that a polyvinyl alcohol with the same average degree of polymerization (the average degree of polymerization measured on the basis of JIS K 6726 "Polyvinyl Alcohol Test Method") as the intended average degree of polymerization was subjected to acetalization with n-butyraldehyde under the catalytic influence of hydrochloric acid, and used as the polyvinyl butyral resin (PVB) used in the following examples and comparative examples.

Example 1

A polyvinyl butyral resin with an average degree of polymerization of approximately 900 and a degree of acetalization of approximately 69 mol % was synthesized, and pressed at a pressure of 100 Kgf/cm² and a hot plate temperature of 150° C. for 10 minutes to prepare a polyvinyl butyral sheet of 0.76 mm in thickness. It is to be noted that the degree of acetalization was measured on the basis of JIS K 6728 "Polyvinyl Butyral Test Method."

1. Property Evaluation (Storage Elastic Modulus)

The measurement was made on the basis of JIS K 7244-4 (established in 1999). The measurement condition is a frequency of 0.3 Hz. The measurement was carried out at a constant rate of temperature increase of 1° C./min from 0° C. to 100° C. The storage elastic modulus of the polyvinyl butyral sheet was 1920 MPa at 25° C., and 1530 MPa at 50° C.

2. Property Evaluation (Adhesion to Glass)

The measurement of the compression shear strength was carried out at 25° C. and 50° C. by the method described above. It is to be noted that samples (12 samples) were used as the laminated glass sample 24, which were prepared by a vacuum bag method (condition: raising the temperature from 30° C. to 160° C. for 60 minutes, and then keeping the temperature at 160° C. for 30 minutes) from the polyvinyl butyral sheet sandwiched between two sheets of commercially available float glass (thickness: 3 mm, size: 25 mm×25 mm). The test was carried out six times at each of 25° C. and 50° C. with the use of each sample. The average values for the measurement results were 52 MPa at 25° C. and 28 MPa at 50° C.

3. Property Evaluation (Rupture Strength)

Laminated glass was prepared by a vacuum bag method (condition: raising the temperature from 30° C. to 160° C. for 60 minutes, and then keeping the temperature at 160° C. for 30 minutes) from the polyvinyl butyral sheet sandwiched between two sheets of commercially available float glass (thickness: 2.8 mm, size: 26 mm×76 mm). Then, the laminated glass was subjected to a three-point bending test with the use of Autograph AG-5000B to measure the rupture strength. It is to be noted that the test was carried out at a test speed of 0.25 mm/min. The rupture strength was 0.80 kN at 25° C. and 0.70 kN at 50° C.

4. Property Evaluation (Laminate Aptitude)

Laminated glass was prepared under the following conditions with the use of a vacuum laminating machine (1522N from Nisshinbo Mechatronics Inc.) from the polyvinyl butyral sheet sandwiched between two sheets of commercially available float glass (thickness: 3.2 mm, size: 1100 mm×1300 mm). The laminate aptitude of the laminated glass obtained was determined according to the following criteria to achieve "⊙."

<Conditions>
Hot Plate Temperature: 165° C.
Vacuuming Time: 12 minutes
Pressing Pressure: 50 kPa
Pressing Time: 17 minutes
<Criteria for Evaluation>
⊙: Favorable adhesion without any defects in appearance such as bubbles or defective adhesion
x: With defects in appearance such as bubbles or defective adhesion 5. Property Evaluation (Creep Resistance)

A sample of 1 cm×8 cm in size and 4 cm in gauge length was cut out from the polyvinyl butyral to carry out a tensile test for 5 hours under the conditions of 85° C., 85% RH, no load, with the use of a creep testing machine (a creep tester No. 145 from Yasuda Seiki Seisakusho, Ltd.). After the test, the gauge length was 4.2 cm, the elongation percentage was 105%, and the sample was determined "⊙" according to the following criteria.

<Criteria for Evaluation>
⊙: Elongation percentage not more than 120%
◯: Elongation percentage more than 120% and not more than 200%
x: More than 200%

6. Property Evaluation (Penetration Resistance Test)

Laminated glass was prepared with the use of a vacuum laminating machine (1522N from Nisshinbo Mechatronics Inc.) from the polyvinyl butyral sheet sandwiched between two sheets of commercially available float glass (thickness: 2.8 mm, size: 300 mm×300 mm). Then, a steel ball of 2260 g was dropped from a height of 2 m in accordance with the penetration resistance test of JIS R 3212. As a result, it was confirmed that the steel ball had penetrated (failed the test). The laminated glass according to Example 1 failed the penetration resistance test from the height of 2 m, and thus, was not subjected to a penetration resistance test of dropping a steel ball of 2260 g from a height of 3 m. It is to be noted that only Examples 12 to 21 were subjected to the penetration resistance test from a height of 3 m.

7. Property Evaluation (MST32 Shock Fracture Test in accordance with Photovoltaic (PV) Module Safety Qualification (IEC61730-2))

Figure 6:
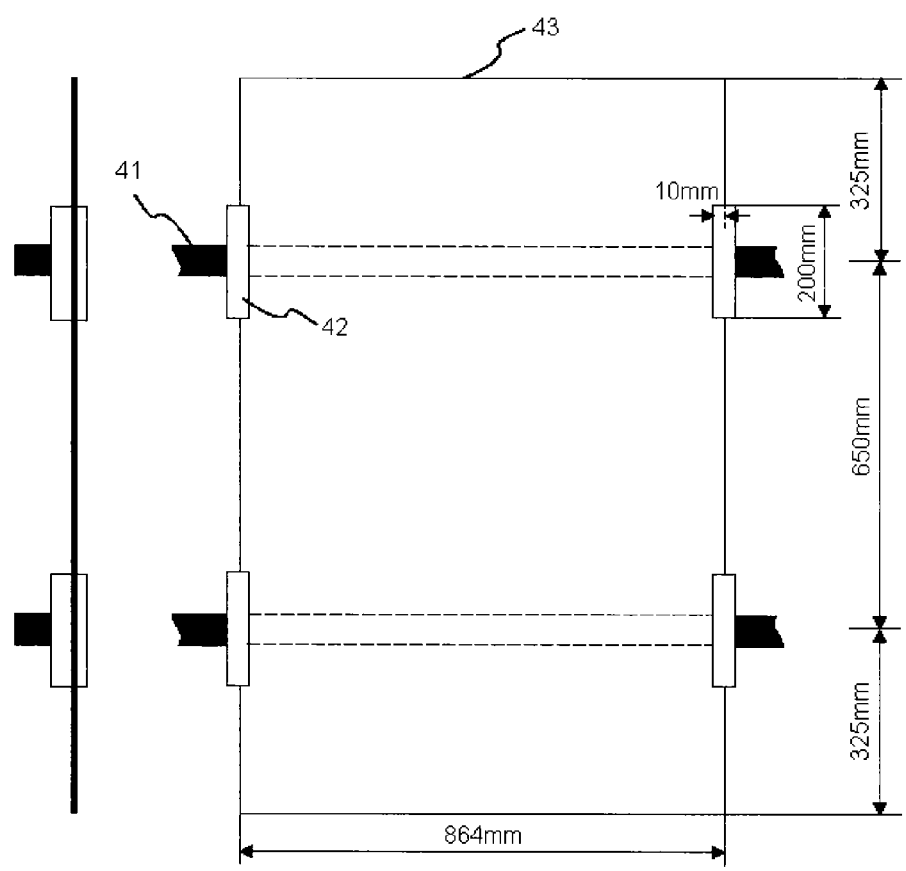
FIG. 6 is a diagram schematically illustrating the front and left side of an implemented product for the MST32 shock fracture test in accordance with the Safety Qualification (IEC61730-2).

Laminated glass was prepared with the use of a vacuum laminating machine (1522N from Nisshinbo Mechatronics Inc.) from the polyvinyl butyral sheet sandwiched between two sheets of commercially available float glass (thickness: 3.2 mm, size: 864 mm (width direction)×1300 mm (longitudinal direction), and regarded as a photovoltaic module. This laminated glass used to carry out the MST32 shock fracture test in accordance with the Photovoltaic (PV) Module Safety Qualification (IEC61730-2) by frameless implementation as shown in FIG. 6, failed the test at a height of 1220 mm. Next, the glass passed the shock fracture test carried out in the same way except for the float glass thickness of 4 mm. It is to be noted that only Examples 1 to 11 were subjected to the shock fracture test with the float glass thickness of 4 mm. FIG. 6 will be described below. Basic foundations 41 for support are formed to have a substantially linear shape, which are intended to serve as foundations for laminated glass 43. The two basic foundations 41 for support are arranged parallel to the width direction (the direction parallel to the laminated glass 43 and perpendicular to the longitudinal direction) without being in contact with the laminated glass 43, in positions of 325 mm respectively from both ends of the laminated glass 43 in the longitudinal direction. Two clamps 42 (200 mm long×10 mm wide (the distance in contact with the glass in the width direction)) for each basic foundation 41 for support are placed on the two basic foundations 41 for support at intervals of approximately 864 mm, in such a way that the four clamps 42 in total fix the laminated glass 43 so that the centers of the clamps 42 are positioned on both ends of the laminated glass 43 in the width direction and at 325 mm from the ends of the laminated glass 43 in the longitudinal direction.

Examples 2 to 7

Polyvinyl butyral sheets were prepared in the same way as in Example 1, with the use of materials (polyvinyl butyral resins) of the compositions shown in Table 1, and evaluated for storage elastic modulus, adhesion to glass, rupture strength, laminate aptitude, creep resistance, penetration resistance test, and shock fracture test. The results are shown in Table 1.

TABLE 1

|  |  |  | Example 1 | Example 2 | Example 3 | Example 4 | Example 5 | Example 6 | Example 7 |
|---|---|---|---|---|---|---|---|---|---|
| Composition | Average Degree of Polymerization | | 900 | 900 | 1100 | 1200 | 1700 | 500 | 600 |
| | Degree of Acetalization | mol % | 69 | 77 | 77 | 77 | 76 | 77 | 77 |
| Properties | Storage Elastic Modulus (MPa) | 25° C. | 1920 | 1120 | 1140 | 1160 | 1370 | 1120 | 1120 |
| | | 50° C. | 1530 | 820 | 840 | 850 | 920 | 820 | 820 |
| | Adhesion to Glass (MPa) | 25° C. | 52 | 35 | 35 | 35 | 36 | 35 | 35 |
| | | 50° C. | 28 | 23 | 23 | 23 | 23 | 23 | 23 |
| | Rupture Strength (kN) | 25° C. | 0.80 | 0.79 | 0.80 | 0.80 | 0.80 | 0.79 | 0.79 |
| | | 50° C. | 0.70 | 0.70 | 0.70 | 0.70 | 0.72 | 0.70 | 0.70 |
| | Laminate Aptitude | | ⊙ | ⊙ | ⊙ | X Defective Adhesion | X Defective Adhesion | ⊙ | ⊙ |
| | Creep Resistance | | ⊙ | ⊙ | ⊙ | ⊙ | ⊙ | X | ⊙ |
| | Penetration Resistance Test | 2 m | Failure | Failure | Failure | Failure | Failure | Failure | Failure |
| | | 3 m | — | — | — | — | — | — | — |
| | Shock Fracture Test (Glass Thickness: 3.2 mm) | | Failure | Failure | Failure | Failure | Failure | Failure | Failure |
| | Shock Fracture Test (Glass Thickness: 4 mm) | | Pass | Pass | Pass | Pass | Pass | Pass | Pass |

[—]: not implemented

Example 8

A polyvinyl butyral resin with an average degree of polymerization of approximately 900 and a degree of acetalization of approximately 69 mol % was synthesized, and pressed at a pressure of 100 Kgf/cm$^2$ and a hot plate temperature of 150° C. for 10 minutes, with the addition of 2 parts by mass of 300 (triethylene glycol-di(2-ethylhexanoate)) as a plasticizer with respect to 100 parts by mass of the polyvinyl butyral resin, thereby preparing a polyvinyl butyral sheet of 0.76 mm in thickness. The prepared polyvinyl butyral sheet was used to make evaluations on storage elastic modulus, adhesion to glass, rupture strength, laminate aptitude, creep resistance, penetration resistance test, and shock fracture test in the same way as in Example 1. The results are shown in Table 2.

Examples 9 to 11

Polyvinyl butyral sheets were prepared in the same way as in Example 8, except that 3GO as a plasticizer was used in the amounts shown in Table 2 with respect to 100 parts by mass of polyvinyl butyral resins with the average degree of polymerization and the degree of acetalization as shown in Table 2. The prepared polyvinyl butyral sheets were used to make evaluations on storage elastic modulus, adhesion to glass, rupture strength, laminate aptitude, creep resistance, penetration resistance test, and shock fracture test in the same way as in Example 1. The results are shown in Table 2.

TABLE 2

|  |  |  | Example 8 | Example 9 | Example 10 | Example 11 |
|---|---|---|---|---|---|---|
| Composition | Average Degree of Polymerization of PVB | | 900 | 900 | 900 | 1700 |
| | Degree of Acetalization of PVB (mol %) | | 69 | 69 | 76 | 69 |
| | Plasticizer (parts by mass, with respect to 100 parts by mass of PVB) | | 2 | 5 | 5 | 10 |
| Properties | Storage Elastic Modulus (MPa) | 25° C. | 1750 | 1420 | 1020 | 1035 |
| | | 50° C. | 1390 | 1040 | 680 | 170 |
| | Adhesion to Glass (MPa) | 25° C. | 50 | 48 | 35 | 35 |
| | | 50° C. | 26 | 25 | 20 | 23 |
| | Rupture Strength (kN) | 25° C. | 0.79 | 0.76 | 0.76 | 0.75 |
| | | 50° C. | 0.70 | 0.63 | 0.57 | 0.51 |
| | Laminate Aptitude | | ⊙ | ⊙ | ⊙ | X Defective Adhesion |
| | Creep Resistance | | ⊙ | ⊙ | ⊙ | ⊙ |
| | Penetration Resistance Test | 2 m | Failure | Failure | Failure | Failure |
| | | 3 m | — | — | — | — |

TABLE 2-continued

|  | Example 8 | Example 9 | Example 10 | Example 11 |
|---|---|---|---|---|
| Shock Fracture Test (Glass Thickness: 3.2 mm) | Failure | Failure | Failure | Failure |
| Shock Fracture Test (Glass Thickness: 4 mm) | Pass | Pass | Pass | Pass |

[—]: not implemented

Example 12

A pellet obtained by mixing 5 parts by mass of a silicone-acrylic composite rubber (METABLEN S2006 from Mitsubishi Rayon Co., Ltd., glass transition temperature: −39° C., average particle size: 200 nm) into 100 parts by mass of a polyvinyl butyral resin with an average degree of polymerization of approximately 1000 and a degree of acetalization of approximately 69 mol % was pressed at a pressure of 100 Kgf/cm² and a hot plate temperature of 150° C. for 10 minutes to prepare a polyvinyl butyral sheet of 0.76 mm in thickness. It is to be noted that the degree of acetalization of the polyvinyl butyral resin was measured on the basis of JIS K 6728 "Polyvinyl Butyral Test Method." In addition, the glass transition temperature of the silicone-acrylic composite rubber was measured on the basis of JIS K 7244-4: 1999, and the peak value of tan δ was employed as the glass transition temperature. The measurement condition is a frequency of 0.3 Hz. The measurement was carried out at a constant rate of temperature increase of 1° C./min from −150° C. to 100° C.

The prepared polyvinyl butyral sheet was used to make evaluations on storage elastic modulus, adhesion to glass, rupture strength, laminate aptitude, creep resistance, penetration resistance test, and shock fracture test in the same way as in Example 1. In addition, the refractive indexes of the polyvinyl butyral resin and rubber used, and the haze of the laminated glass using the polyvinyl butyral sheet were evaluated by the following methods. The results are shown in Table 3.

8. Property Evaluation (Refractive Index)

The measurement was made on the basis of JIS K 7142.

9. Property Evaluation (Haze)

The measurement was made on the basis of JIS K 7136 with the use of the laminated glass sample as used in the measurement of the adhesion to glass (compression shear strength).

Examples 13 to 21

Polyvinyl butyral sheets were prepared in the same way as in Example 12, with the use of materials (polyvinyl butyral resins and rubbers) of the compositions shown in Tables 3 and 4, and evaluated for storage elastic modulus, adhesion to glass, rupture strength, haze, laminate aptitude, creep resistance, penetration resistance test, and shock fracture test. The results are shown in Tables 3 and 4. It is to be noted that the silicone-acrylic composite rubber used in Example 12 was used in Examples 13 to 16 and Examples 18 to 21. In Example 17, a commercially available acrylic rubber (METABLEN W377 from Mitsubishi Rayon Co., Ltd.; glass transition temperature: −18° C., average particle size: 200 nm) was used as the rubber.

TABLE 3

|  |  |  | Examples | | | | | |
|---|---|---|---|---|---|---|---|---|
|  |  |  | 12 | 13 | 14 | 15 | 16 | 17 |
| Composition | Average Degree of Polymerization of PVB | | 1000 | 1000 | 1000 | 1000 | 1700 | 1000 |
|  | Degree of Acetalization of PVB (mol %) | | 69 | 69 | 69 | 69 | 69 | 69 |
|  | Refractive Index of PVB | | 1.49 | 1.49 | 1.49 | 1.49 | 1.49 | 1.49 |
|  | Rubber (parts by mass, with respect to 100 parts by mass of PVB) | | 5 | 11 | 33 | 54 | 11 | 33 |
|  | Refractive Index of Rubber | | 1.46 | 1.46 | 1.46 | 1.46 | 1.46 | 1.49 |
|  | Glass Transition Temperature of Rubber (° C.) | | −39 | −39 | −39 | −39 | −39 | −18 |
| Properties | Storage Elastic Modulus (MPa) | 25° C. | 1720 | 1440 | 1220 | 1100 | 1440 | 1230 |
|  |  | 50° C. | 1330 | 1250 | 920 | 800 | 1250 | 800 |
|  | Adhesion to Glass (MPa) | 25° C. | 35 | 33 | 26 | 21 | 33 | 26 |
|  |  | 50° C. | 20 | 19 | 15 | 12 | 19 | 15 |
|  | Rupture | 25° C. | 0.80 | 0.78 | 0.75 | 0.74 | 0.78 | 0.74 |

TABLE 3-continued

|  | | Examples | | | | | |
| --- | --- | --- | --- | --- | --- | --- | --- |
|  | | 12 | 13 | 14 | 15 | 16 | 17 |
| Strength | 50° C. | 0.70 | 0.69 | 0.63 | 0.61 | 0.69 | 0.61 |
| (kN) | | | | | | | |
| Haze (%) | | 13 | 23 | 43 | 54 | 23 | 1 |
| Laminate Aptitude | | ⊙ | ⊙ | ⊙ | ⊙ | X | ⊙ |
| Creep Resistance | | ⊙ | ⊙ | ⊙ | ⊙ | ⊙ | ⊙ |
| Penetration | 2 m | Pass | Pass | Pass | Pass | Pass | Pass |
| Resistance | 3 m | Failure | Pass | Pass | Pass | Pass | Failure |
| Test | | | | | | | |
| Shock Fracture Test | | Pass | Pass | Pass | Pass | Pass | Pass |
| (Glass Thickness: 3.2 mm) | | | | | | | |

TABLE 4

|  | | | Examples | | | |
| --- | --- | --- | --- | --- | --- | --- |
|  | | | 18 | 19 | 20 | 21 |
| Composition | Average Degree of Polymerization of PVB | | 500 | 600 | 900 | 1200 |
|  | Degree of Acetalization of PVB (mol %) | | 69 | 69 | 69 | 69 |
|  | Refractive Index of PVB | | 1.49 | 1.49 | 1.49 | 1.49 |
|  | Rubber (parts by mass, with respect to 100 parts by mass of PVB) | | 11 | 11 | 11 | 11 |
|  | Refractive Index of Rubber | | 1.46 | 1.46 | 1.46 | 1.46 |
|  | Glass Transition Temperature of Rubber (° C.) | | −39 | −39 | −39 | −39 |
| Properties | Storage Elastic Modulus (MPa) | 25° C. | 1440 | 1440 | 1440 | 1440 |
|  | | 50° C. | 1250 | 1250 | 1250 | 1250 |
|  | Adhesion to Glass (MPa) | 25° C. | 33 | 33 | 33 | 33 |
|  | | 50° C. | 19 | 19 | 19 | 19 |
|  | Rupture Strength (kN) | 25° C. | 0.78 | 0.78 | 0.78 | 0.78 |
|  | | 50° C. | 0.69 | 0.69 | 0.69 | 0.69 |
|  | Haze (%) | | 23 | 23 | 23 | 23 |
|  | Laminate Aptitude | | ⊙ | ⊙ | ⊙ | X |
|  | Creep Resistance | | X | ○ | ⊙ | ⊙ |
|  | Penetration Resistance Test | 2 m | Pass | Pass | Pass | Pass |
|  | | 3 m | Pass | Pass | Pass | Pass |
|  | Shock Fracture Test (Glass Thickness: 3.2 mm) | | Pass | Pass | Pass | Pass |

Comparative Example 1

A polyvinyl butyral resin with an average degree of polymerization of approximately 1700 and a degree of acetalization of approximately 69 mol % was synthesized, and pressed at a pressure of 100 Kgf/cm² and a hot plate temperature of 140° C. for 10 minutes, with the addition of 20 parts by mass of 3GO as a plasticizer with respect to 100 parts by mass of the polyvinyl butyral resin, thereby preparing a polyvinyl butyral sheet of 0.76 mm in thickness. The prepared polyvinyl butyral sheet was used to make evaluations on storage elastic modulus, adhesion to glass, rupture strength, laminate aptitude, creep resistance, penetration resistance test, and shock fracture test in the same way as in Example 1. The results are shown in Table 5.

Comparative Example 2

A polyvinyl butyral resin with an average degree of polymerization of approximately 1700 and a degree of acetalization of approximately 69 mol % was synthesized, and pressed at a pressure of 100 Kgf/cm² and a hot plate temperature of 140° C. for 10 minutes, with the addition of 35 parts by mass of 3GO as a plasticizer with respect to 100 parts by mass of the polyvinyl butyral resin, thereby preparing a polyvinyl butyral sheet of 0.76 mm in thickness. The prepared polyvinyl butyral sheet was used to make evaluations on storage elastic modulus, adhesion to glass, rupture strength, laminate aptitude, creep resistance, penetration resistance test, and shock fracture test in the same way as in Example 1. The results are shown in Table 5.

Comparative Example 3

A pellet obtained by mixing 300 parts by mass of a silicone-acrylic composite rubber (METABLEN S2006 from Mitsubishi Rayon Co., Ltd., glass transition temperature: −39° C., average particle size: 200 nm) into 100 parts by mass of a polyvinyl butyral resin with an average degree of polymerization of approximately 1000 and a degree of acetalization of approximately 69 mol % was pressed at a pressure of 100 Kgf/cm² and a hot plate temperature of 180° C. for 10 minutes to prepare a polyvinyl butyral sheet of 0.76 mm in thickness. The prepared polyvinyl butyral sheet was used to make evaluations on storage elastic modulus, adhesion to glass, rupture strength, and laminate aptitude in the same way as in Example 1. Furthermore, in order to carry out the penetration resistance test, an attempt was made to prepare a laminated glass sample for the penetration resistance test. However, no laminated glass samples was able to be prepared because the insufficient fluidity of the polyvinyl butyral sheet. The results are shown in Table 5.

Comparative Example 4

An ionomer resin sheet (SentryGlas (Registered Trademark) Plus (SGP) from DuPont) was evaluated for storage elastic modulus, adhesion to glass, rupture strength, laminate aptitude, penetration resistance test, and shock fracture test in the same way as in Example 1. The results are shown in Table 5.

Comparative Example 5

An EVA sheet for solar cells (EVASAFE from Bridgestone Corporation) was evaluated for storage elastic modulus, adhesion to glass, rupture strength, laminate aptitude, creep resistance, penetration resistance test, and shock fracture test in the same way as in Example 1. The results are shown in Table 5.

Comparative Example 6

A PMMA resin (Kuraray Parapet HR-L from Kuraray Co., Ltd.) was pressed at a pressure of 100 Kgf/cm$^2$ and a hot plate temperature of 200° C. for 10 minutes to prepare a polyvinyl butyral sheet of 0.76 mm in thickness. The prepared sheet was used to make evaluations on storage elastic modulus, adhesion to glass, rupture strength, laminate aptitude, and creep resistance in the same way as in Example 1. The results are shown in Table 5.

TABLE 5

|  |  |  | Comparative Examples | | | | | |
|---|---|---|---|---|---|---|---|---|
|  |  |  | 1 | 2 | 3 | 4 | 5 | 6 |
|  | Composition |  | Plasticized PVB | Plasticized PVB | Rubber Containing PVB | SGP | EVA | PMMA |
| Properties | Storage Elastic Modulus (MPa) | 25° C. | 538 | 21 | 250 | 341 | 7 | 2400 |
|  |  | 50° C. | 3 | 1 | 175 | 40 | 2 | 1900 |
|  | Adhesion to Glass (MPa) | 25° C. | 25 | 21 | 6 | 22 | 23 | 0 |
|  |  | 50° C. | 7 | 5 | 4 | 7 | 4 | 0 |
|  | Rupture Strength (kN) | 25° C. | 0.71 | 0.46 | 0.60 | 0.72 | 0.50 | 0.40 |
|  |  | 50° C. | 0.40 | 0.37 | 0.48 | 0.49 | 0.39 | 0.38 |
|  | Laminate Aptitude |  | ⊙ | ⊙ | X | ⊙ | ⊙ | ⊙ |
|  | Creep Resistance |  | ○ | ○ | — | — | ⊙ | ⊙ |
|  | Penetration Resistance Test | 2 m | Pass | Pass | — | Pass | Pass | — |
|  |  | 3 m | — | — | — | — | — | — |
|  | Shock Fracture Test (Glass Thickness: 3.2 mm) |  | Pass | Pass | — | Pass | Pass | — |

[—]: not implemented

From the examples and the comparative examples, it is determined that it is important for the storage elastic modulus and the adhesion to glass (the compression shear strength) to fall within specific ranges in order to increase the rupture strength. Commercially available float glass (5.7 mm in thickness, 26 mm×76 mm in size) has a rupture strength on the order of 0.82 kN, and it is thus determined that laminated glass using the interlayer film for laminated glass according to the present invention achieves a load bearing property comparable to that of float glass which has substantially the same thickness.

Furthermore, from the examples and comparative examples, it is determined that it is important that a steel ball of 2260 g does not penetrate the laminate with glass of 2.8 mm in thickness bonded at both surfaces when the steel ball is dropped from a height of 2 m in accordance with the penetration resistance test of JIS R 3212, in order to pass the MST32 Shock Fracture Test in accordance with the Photovoltaic (PV) Module Safety Qualification (IEC61730-2) even in the case of using thinner glass.

It is to be noted that when the average degrees of polymerization for the polyvinyl butyral resins in the examples and the comparative examples are expressed in terms of the weight average molecular weights (Mw) of the polyvinyl butyral resins, the weight average molecular weight (Mw) is 57,000 in the case of 900 in terms of average degree of polymerization, the weight average molecular weight (Mw) is 63,000 in the case of 1000 in terms of average degree of polymerization, the weight average molecular weight (Mw) is 68,000 in the case of 1100 in terms of average degree of polymerization, the weight average molecular weight (Mw) is 80,000 in the case of 1200 in terms of average degree of polymerization, and the weight average molecular weight (Mw) is 110,000 in the case of 1700 in terms of average degree of polymerization.

DESCRIPTION OF REFERENCE SYMBOLS 11 front transparent protective member
12 back protective member
13 encapsulant
13A front encapsulant
13B back encapsulant
14 photovoltaic cell
15 frame
16 photovoltaic cell
21 encapsulant
22 glass
23 glass
24 laminated glass sample
31 jig for measuring compression shear strength (lower section)
31a concave section
31b incline
32 jig for measuring compression shear strength (upper section)
32a concave section
41 basic foundation for support
42 clamp
43 laminated glass

The invention claimed is:
1. An article comprising a polyvinyl acetal resin, wherein the article comprises 60 mass % or more of the polyvinyl acetal resin and said polyvinyl acetal resin is produced from a polyvinyl alcohol with a degree of saponification of 95 mol % or more, wherein the article has a storage elastic modulus of 1000 to 4000 MPa measured at a frequency of 0.3 Hz and 25° C. in accordance with JIS K 7244-4, and has a compression shear strength of 5 to 80 MPa measured at 25° C. for a laminate with glass bonded at both surfaces, said article is an interlayer film for laminated glass, and wherein a total film thickness of the interlayer film for laminated glass is 100 to 3,000 μm.

2. The article according to claim 1, wherein a steel ball does not penetrate through a laminate with glass of 2.8 mm in thickness bonded at both surfaces of the article when the steel ball is dropped from a height of 2 m to the laminate in accordance with a penetration resistance test of JIS R 3212.

3. The article according to claim 1, comprising 80 mass % or more of a polyvinyl acetal resin.

4. The article according to claim 3, further comprising 10 parts by mass or less of a plasticizer, with respect to 100 parts by mass of the polyvinyl acetal resin.

5. The article according to claim 3, wherein an average degree of polymerization of the polyvinyl acetal resin is from 600 to 1100.

6. The article according to claim 3, further comprising a rubber.

7. The article according to claim 6, comprising 1 to 100 parts by mass of the rubber, with respect to 100 parts by mass of the polyvinyl acetal resin.

8. The article according to claim 6, wherein the rubber has a glass transition temperature of −10° C. or lower.

9. The article according to claim 6, wherein a difference in refractive index between the rubber and the polyvinyl acetal resin is 0.04 or less.

10. A laminated glass, comprising an interlayer film for laminated glass according to claim 1.

11. A laminated glass, comprising an interlayer film for laminated glass according to claim 4.

12. An article comprising a polyvinyl acetal resin, wherein the article comprises 60 mass % or more of the polyvinyl acetal resin and said polyvinyl acetal resin is produced from a polyvinyl alcohol with a degree of saponification of 95 mol % or more, wherein the article has a storage elastic modulus of 50 to 4000 MPa measured at a frequency of 0.3 Hz and 50° C. in accordance with JIS K 7244-4, and has a compression shear strength of 5 to 80 MPa measured at 50° C. for a laminate with glass bonded at both surfaces, said article is an interlayer film for laminated glass, and wherein a total film thickness of the interlayer film for laminated glass is 100 to 3,000 μm.

13. A laminated glass, comprising an interlayer film for laminated glass according to claim 12.

* * * * *